United States Patent
Yoon et al.

(10) Patent No.: US 11,124,110 B2
(45) Date of Patent: Sep. 21, 2021

(54) CAR LAMP USING SEMICONDUCTOR LIGHT EMITTING DEVICE

(71) Applicant: ZKW Group GmbH, Wieselburg (AT)

(72) Inventors: Shinwoo Yoon, Seoul (KR); Hankyu Cho, Seoul (KR); Myungwoo Jung, Seoul (KR)

(73) Assignee: ZKW Group GmbH, Wieselburg (AT)

( * ) Notice: Subject to any disclaimer, the term of this patent is extended or adjusted under 35 U.S.C. 154(b) by 209 days.

(21) Appl. No.: 16/244,787

(22) Filed: Jan. 10, 2019

(65) Prior Publication Data

US 2019/0217768 A1 Jul. 18, 2019

Related U.S. Application Data

(60) Provisional application No. 62/619,039, filed on Jan. 18, 2018.

(30) Foreign Application Priority Data

Jun. 8, 2018 (KR) ........................ 10-2018-0066277

(51) Int. Cl.
| | |
|---|---|
| *B60Q 1/00* | (2006.01) |
| *B60Q 1/26* | (2006.01) |
| *F21S 8/00* | (2006.01) |
| *F21Y 115/10* | (2016.01) |
| *F21S 41/20* | (2018.01) |
| *F21W 107/10* | (2018.01) |

(Continued)

(52) U.S. Cl.
CPC .............. *B60Q 1/2696* (2013.01); *F21S 8/00* (2013.01); *F21S 41/153* (2018.01); *F21S 41/285* (2018.01);

(Continued)

(58) Field of Classification Search
CPC ...... B60Q 1/2696; F21S 41/47; F21S 41/143; F21S 41/153; F21S 41/155; F21S 41/285;
(Continued)

(56) References Cited

U.S. PATENT DOCUMENTS

2005/0263775 A1 12/2005 Ikeda et al.
2015/0155346 A1* 6/2015 Motoyama .......... H01L 51/5265
257/89

(Continued)

FOREIGN PATENT DOCUMENTS

| EP | 3480847 | 5/2019 |
|---|---|---|
| JP | 2008284795 | 11/2008 |

(Continued)

OTHER PUBLICATIONS

Extended European Search Report in European Patent Application No. 19151862.0, dated May 29, 2019, 7 pages.

*Primary Examiner* — Y M. Quach Lee
(74) *Attorney, Agent, or Firm* — Fish & Richardson P.C.

(57) ABSTRACT

The present invention provides a car lamp, including a light source unit provided with a plurality of semiconductor light emitting devices, and having a planar shape, the light source unit having a light emitting region emitting light and a non-light emitting region formed along an edge of the light emitting region, and a filter unit located to overlap the light emitting region so as to transmit only light of a predetermined wavelength band therethrough, wherein the light emitting region of the light source unit is provided with a plurality of regions, and is configured such that at least one of the plurality of regions selectively emits light.

8 Claims, 6 Drawing Sheets

(51) Int. Cl.
*F21S 41/153* (2018.01)
*H01L 27/32* (2006.01)
*H01L 51/52* (2006.01)

(52) U.S. Cl.
CPC ...... *F21W 2107/10* (2018.01); *F21Y 2115/10* (2016.08); *H01L 27/322* (2013.01); *H01L 51/5284* (2013.01)

(58) Field of Classification Search
CPC .... F21S 8/00; F21W 2107/10; F21Y 2115/10; H01L 25/0753; H01L 33/44; H01L 27/322; H01L 51/5278; H01L 51/5284; H01L 2251/5338
See application file for complete search history.

(56) References Cited

U.S. PATENT DOCUMENTS

2019/0203896 A1* 7/2019 Jo ........................... B60Q 1/04
2020/0279979 A1* 9/2020 Lee ...................... H01L 33/504

FOREIGN PATENT DOCUMENTS

| KR | 1020130114368 | 10/2013 |
| KR | 1020160076493 | 6/2016 |
| KR | 1020170017745 | 2/2017 |
| KR | 1020170057851 | 5/2017 |
| KR | 20180003239 | 1/2018 |
| WO | WO2008075615 | 6/2008 |
| WO | WO2016170856 | 10/2016 |

* cited by examiner

CAR LAMP USING SEMICONDUCTOR LIGHT EMITTING DEVICE

CROSS-REFERENCE TO RELATED APPLICATION

Pursuant to 35 U.S.C. § 119(a), this application claims the benefit of an earlier filing date of and the right of priority to U.S. Provisional Application No. 62/619,039 filed on Jan. 18, 2018 and Korean Application No. 10-2018-0066277, filed on Jun. 8, 2018, the contents of which are incorporated by reference herein in its entirety.

FIELD

The present invention relates to a car lamp (or vehicle lamp), and more particularly, a car lamp using a semiconductor light emitting device.

BACKGROUND

A vehicle or car is equipped with various lamps having lighting functions and signaling functions. In general, halogen lamps or gas discharge lamps are usually used, but in recent years, light emitting diodes (LEDs) are in the spotlight as light sources for vehicle lamps.

The LED can enhance a degree of freedom for design of a lamp by minimizing a size thereof and exhibit economic efficiency by virtue of a semi-permanent lifespan, but most of the LEDs are currently produced in a form of a package. The LED itself other than the package is a semiconductor light emitting device of converting a current into light and is under development as an image displaying light source equipped in an electronic device such as an information communication device.

Car lamps ever developed use the LEDs in the package form and thereby have disadvantages, such as a low mass production yield rate, high fabrication costs and low flexibility.

SUMMARY

One aspect of the present invention is to minimize a thickness of a lamp for a vehicle (or a car) and to minimize a lamp structure capable of maximizing a quantity of light.

Another aspect of the present invention is to realize a plurality of lamp functions through a single light source.

Still another aspect of the present invention is to provide a lamp for a vehicle using a flexible light source.

To achieve those aspects and other advantages in the present invention, there is provided a car lamp, the lamp including a light source unit provided with a plurality of semiconductor light emitting devices, and having a planar shape, the light source unit having a light emitting region emitting light and a non-light emitting region formed along an edge of the light emitting region, and a filter unit located to overlap the light emitting region so as to transmit only light of a predetermined wavelength band therethrough, wherein the light emitting region of the light source unit is provided with a plurality of regions, and is configured such that at least one of the plurality of regions selectively emits light.

In one embodiment, the non-light emitting region which does not emit light may be formed along an edge of each of the plurality of regions, and a light shielding unit may be located at the edge of each of the regions.

In one embodiment, the filter unit may include a first filter portion overlapping one of the plurality of regions to transmit only light of a predetermined wavelength band therethrough, and a second filter portion overlapping another region different from the one region to transmit only light of a wavelength band different from the light of the predetermined wavelength band.

In one embodiment, the first and second filter portions may be located on the same plane, and the light shielding unit may be stacked on the first and second filter portions.

In one embodiment, the light shielding unit may be located to overlap parts of the first and second filter portions.

In one embodiment, the first and second filter portions and the light shielding unit may be located on the same plane.

In one embodiment, a width of the light-shielding unit may become wider toward the light source unit.

In one embodiment, the light source unit may be bendable.

In one embodiment, the lamp may further include a light-transmitting layer overlapping the plurality of light-emitting regions and formed to be bendable.

In one embodiment, the light-transmitting layer may be provided with a concave-convex portion to change a proceeding direction of light.

In one embodiment, each of the plurality of light emitting regions may emit white light. The first filter portion may transmit red light therethrough, and the second filter portion may transmit yellow light therethrough.

In one embodiment, at least one of the plurality of light-emitting regions may not overlap the filter unit so that white light is emitted to outside.

In one embodiment, the lamp may further include a heat dissipation layer located below the light source unit.

In one embodiment, the lamp may further include a lens unit located above the light source unit.

In one embodiment, the lens unit may be provided with a light shielding region located on a partial region thereof to absorb light.

In one embodiment, the light-emitting region may include a plurality of light emitting devices each provided with a hole injection layer, a hole transporting layer, a light emitting layer, an electron transporting layer, and an electron injection layer stacked in a sequential manner.

In one embodiment, the lamp may further include a charge generating layer located between the plurality of light emitting devices, and having an upper surface in contact with the hole injection layer and a lower surface in contact with the electron injection layer.

In one embodiment, a refractive index of the charge generating layer may be between a refractive index of the hole injection layer and a refractive index of the electron injection layer.

Effects of the Disclosure

According to the present invention, a lamp can be implemented by stacking two or three sheets together, which may result in reducing a thickness of the lamp.

In addition, according to the present invention, light of different colors can be emitted from a single light source unit. Accordingly, the present invention can implement a plurality of lamp functions by use of the single light source unit.

Further, according to the present invention, a quantity of light of a lamp can increase by using a light emitting device in which a plurality of unit devices each having a hole injection layer, a hole transporting layer, a light emitting layer, an electron transporting layer, and an electron injection layer are located in a stacked manner.

DETAILED DESCRIPTION OF THE PREFERRED EMBODIMENT

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present invention is not limited by the accompanying drawings.

It will be understood that when an element such as a layer, area or substrate is referred to as being "on" another element, it can be directly on the element, or one or more intervening elements may also be present.

A car lamp described in this specification may include a head lamp, a tail lamp, a position lamp, a fog lamp, a turn signal lamp, a brake lamp, an emergency lamp, a backup lamp, and the like. However, it will be readily apparent to those skilled in the art that the configuration according to the embodiments described herein may also be applied to a new product type that will be developed later if the device is a device having a lighting device.

Figure 1:
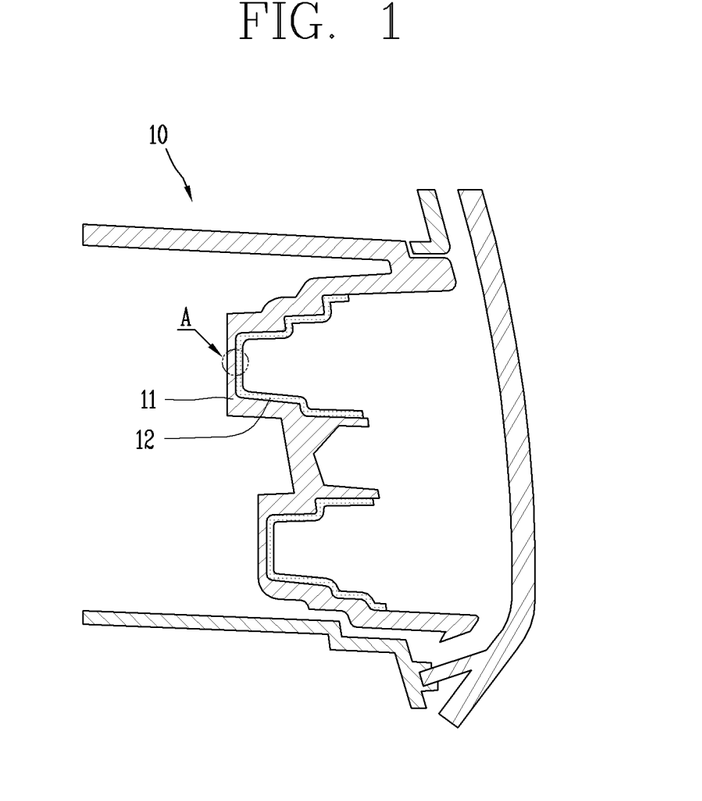
FIG. 1 is a conceptual view illustrating one embodiment of a lamp for a vehicle (a car lamp or a vehicle lamp) using a semiconductor light emitting device according to the present invention.

FIG. 1 is a conceptual view illustrating one embodiment of a car lamp according to the present invention.

A car lamp 10 according to one embodiment of the present invention includes a frame 11 fixed to a vehicle body, and a light source unit 12 installed on the frame 11.

A wiring line for supplying power to the light source unit 12 may be connected to the frame 11, and the frame 11 may be fixed to the vehicle body directly or by using a bracket. According to the present invention, the car lamp 10 may be provided with a lens unit to more diffuse and sharpen light emitted from the light source unit 12.

The light source unit 12 may be a flexible light source unit that can be curved, bent, twisted, folded, or rolled by external force.

In a non-curved state of the light source unit 12 (for example, a state having an infinite radius of curvature, hereinafter, referred to as a first state), the light source unit 12 is flat. When the first state is switched to a state that the light source unit 12 is bent by an external force (e.g., a state having a finite radius of curvature, hereinafter, referred to as a second state), the flexible light source unit may have a curved surface with at least part curved or bent.

A pixel of the light source unit 12 may be implemented by an organic light emitting device. The present invention exemplarily illustrates a light emitting diode (LED) as a type of semiconductor light emitting device for converting current into light. The LED may be a light emitting device having a small size, and may thus serve as a pixel even in the second state.

The light source unit 12 may be provided with only the unit light source. Hereinafter, the unit light source will be described in detail based on the light source unit 12 provided with only the unit light source. Although the structure of the planar light source unit 12 is described herein for convenience of description, the light source unit 12 according to the present invention may include a curved region.

Figure 2:
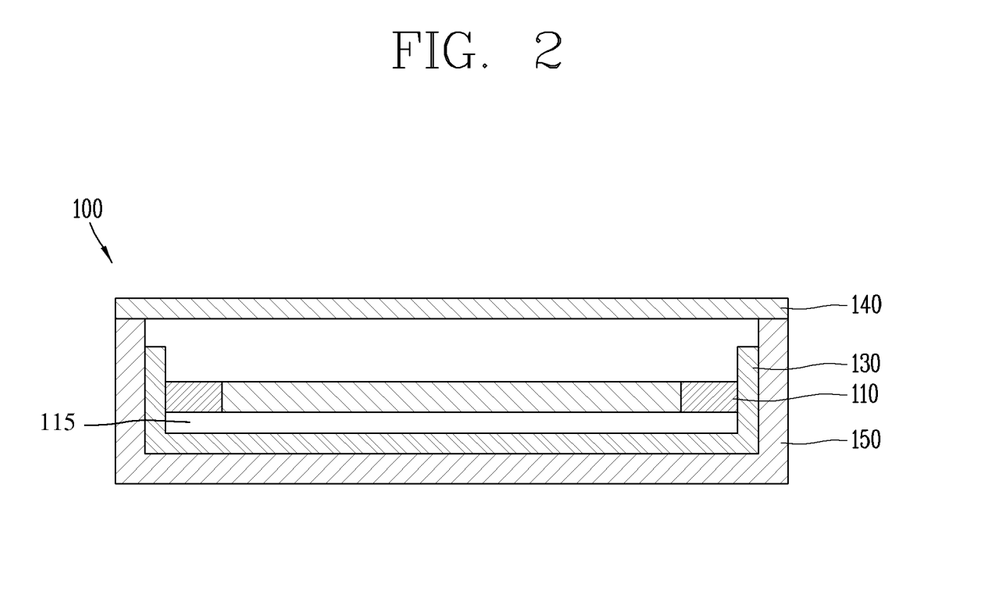
FIG. 2 is a conceptual view illustrating a cross section of a light source unit according to the present invention.
Figure 3:
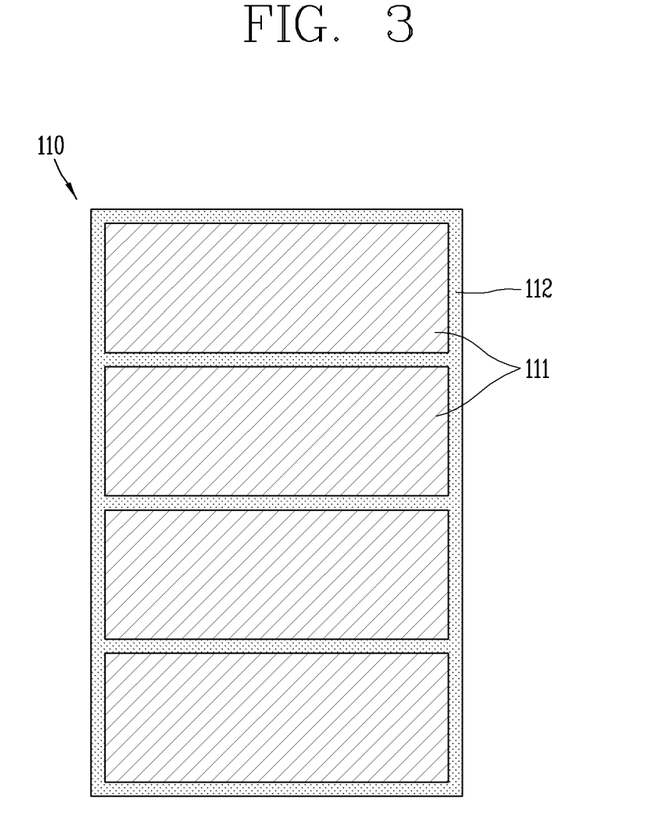
FIG. 3 is a planar view of a light source unit according to the present invention.
Figure 4:
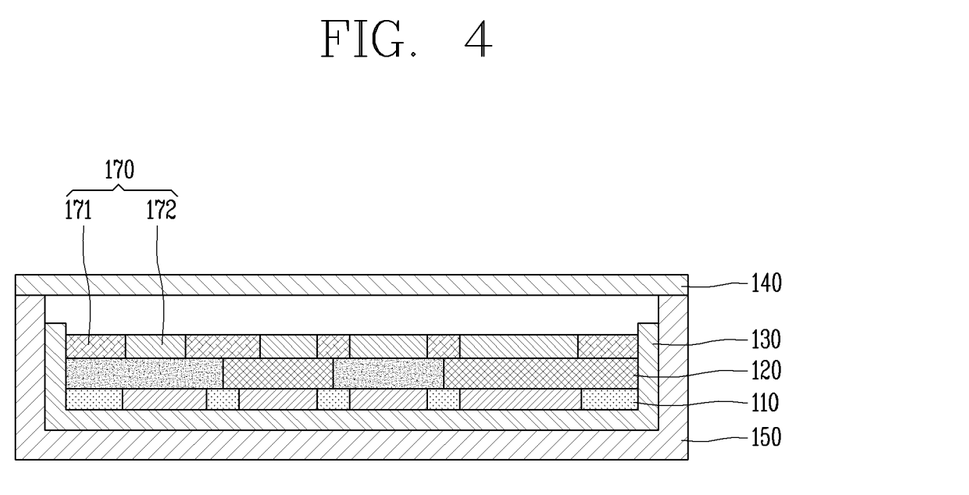
FIGS. 4 and 5 are sectional views briefly illustrating a part A in FIG. 1.
Figure 5:
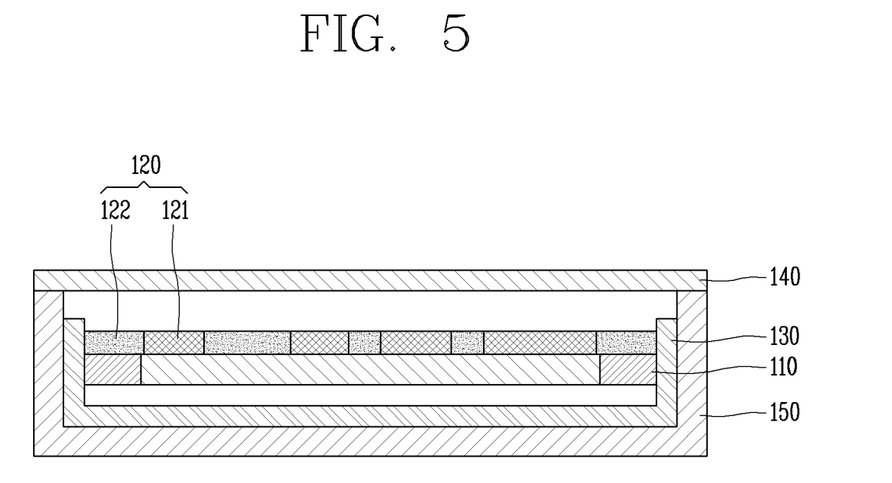

FIG. 2 is a conceptual view illustrating a cross section of a light source unit according to the present invention, FIG. 3 is a planar view of a light source unit according to the present invention, and FIGS. 4 and 5 are sectional views briefly illustrating a part A in FIG. 1.

The car lamp (or vehicle lamp) according to the present invention includes a light source unit and a filter unit, and a light emitting region of the light source unit is divided into a plurality of regions. The car lamp selectively turns on at least one of the plurality of regions. Hereinafter, a car lamp including the aforementioned components will be described in detail.

Referring to FIGS. 2 and 3, the light source unit includes a plurality of semiconductor light emitting devices, and has a planar or flat shape. Here, forming the light source unit in the planar shape does not mean that a light emitting surface of the semiconductor light emitting device must cover an entire surface. Even if the light emitting surfaces of the plurality of semiconductor light emitting devices are arranged at predetermined intervals, it may be referred to as a planar type light source unit when a user recognizes an entire lamp as a surface.

The light source unit 110 includes light emitting regions 111 for emitting light and a non-light emitting region 112 formed along edges of the light emitting regions.

A plurality of semiconductor light emitting devices are located in the light emitting regions 111. The light emitting regions may be switched from one of a first state in which light is emitted and a second state in which light is not emitted to another state. The plurality of light emitting regions 111 included in the light source unit 110 may be individually turned on. Accordingly, the present invention can allow the light emitting regions 111 included in the light source unit 110 to be utilized as different functions, respectively. For example, the present invention allows one of the plurality of light emitting regions to be utilized as a stoplight of a vehicle and another to be used as a turn signal lamp. As the number of the light emitting regions included in the light source unit increases, functions to be realized in a single light source unit may increase.

The non-light emitting region 112 may be provided with wiring electrodes for applying a voltage to each of the semiconductor light emitting devices. In order to individually control the plurality of light emitting regions 111, a wiring structure may be complicated. Thus, such wirings are located in the non-light emitting region 112.

On the other hand, referring to FIG. 2, the light source unit 110 is supported by a bracket 130. Further, the bracket 130 is supported by a housing 150. One surface of the housing 150 is covered with a lens 140.

The bracket 130 and the light source unit 110 may be coupled to each other through an adhesive, or may be coupled to each other in a sliding or hooking manner.

An air gap may be formed or a heat dissipation layer 115 may be located between the bracket 130 and the light source unit 110. The bracket 130 is fixed to the housing 150 while supporting the light source unit 110. However, the present invention is not limited thereto, and the light source unit 110 may alternatively be directly fixed to the housing 150 without the bracket 130.

The bracket 130 or the housing 150 is not an essential component of the lamp according to the present invention, but may be utilized for facilitating assembling of the lamp or for forming appearance of the lamp.

The lens 140 serves to collect light emitted from the light source unit 110 in a specific direction or partially block the light emitted from the light source unit 110. This will be described later.

On the other hand, a filter unit and a light shielding unit to be described later may be supported by the bracket 130 together with the light source unit 110, or may be fixed to the housing 150. Hereinafter, a description of a coupling relationship between the filter unit or the light shielding unit and the bracket 130 or the housing 150 will be omitted.

Referring to FIGS. 4 and 5, the filter unit 120 overlaps the light emitting regions to transmit only light of a predetermined wavelength band therethrough. A color of light to be emitted from the lamp may differ depending on a function to be implemented in the car lamp. For example, red light must be emitted to the outside from a stoplight, and yellow light must be emitted to the outside from a turn signal lamp. In order to realize different functions in the plurality of light emitting regions, respectively, light of a different color should be emitted to the outside from each light emitting region.

The filter unit 120 allows light of different colors to be emitted from the plurality of light emitting regions, respectively. In detail, the filter unit 120 includes a first filter portion that overlaps one of the plurality of regions and transmits only light of a predetermined wavelength band, and a second filter portion that overlaps another region different from the one region and transmits only light of a wavelength band different from the light of the predetermined wavelength band. Accordingly, the present invention can make the plurality of light emitting regions emit light of different colors, respectively.

In one embodiment, white light may be emitted from all the light emitting regions 111 of the light source unit 110. The first filter portion may transmit red light therethrough, and the second filter portion may transmit yellow light therethrough. Some of the light emitting regions 111 may not overlap the filter unit 120. Accordingly, the white light emitted from the light emitting regions 111 can be directly discharged to the outside. Accordingly, the present invention can realize white light, red light, and yellow light through the single light source unit.

The light source unit 110 including the light emitting regions 111 and the non-light emitting region 112 has a planar shape and is very thin, which may result in facilitating an arrangement of the light source unit 110 even in a narrow space. However, since the non-light emitting region 112 is provided with power distribution electrodes, it may spoil the appearance of the lamp when exposed to the outside. The present invention provides a structure for preventing the non-light emitting region 112 from damaging the appearance of the lamp.

To this end, the lamp according to the present invention further includes a light shielding unit. The light shielding unit absorbs light so that the light cannot be discharged to the outside. The light shielding unit may be formed in a sheet shape and absorb light. Accordingly, light emitted from the light-emitting region 111 overlapping the light-shielding unit is not discharged to the outside.

The light shielding unit is located to overlap the non-light emitting region where light is not emitted. The non-light emitting region 111 is not exposed to the outside due to the light shielding unit.

In one embodiment, the non-light emitting region 112 which does not emit light may be formed along the respective edges of the plurality of light emitting regions 111. The light shielding unit 170 may be located at the edges of the respective regions so as to prevent the non-light emitting region from being exposed to the outside.

The light shielding unit may be located on a different layer from the filter unit. Alternatively, the light shielding unit may be located on the same plane as the filter unit.

First, one embodiment in which the light-shielding unit and the filter unit are located on different planes will be described, with reference to FIG. 4. The first and second filter portions are located on the light source unit 110. The first and second filter portions are located on the same plane, and a separate structure may not be formed between the first and second filter portions. The first and second filter portions may form a single sheet.

In this case, a light leakage phenomenon may occur at a boundary surface between the first and second filter portions. In a detailed example, when one of the plurality of light emitting regions overlaps the first filter portion and another region different from the one region overlaps the second filter portion, light emitted from the one region may partially be discharged to the outside through the second filter portion. In such a case, light of an undesired color may be emitted from the car lamp.

In order to prevent this, the lamp according to the present invention may further include the light shielding unit 170. The light shielding unit 170 may include a light-shielding region 171 and a light-transmitting region 172. The light-shielding region 171 is located at a boundary between the first and second filter portions and overlaps with parts of the first and second filter portions, to prevent a light leakage phenomenon occurring at a boundary surface of the filter unit. The light-transmitting region 172 and the light-shielding region 171 may be located on the same plane to form a single sheet. The light-transmitting region 172 is not an essential component of the light shielding unit 170 but may increase a contact area between the light shielding unit 170 and the filter unit 120 so as to prevent the light shielding unit 170 from being separated from the filter unit 120 and also prevent damage on a surface of the filter unit 120.

Hereinafter a structure in which the filter unit 120 and the light shielding unit are located on the same plane will be described with reference to FIG. 5.

The first and second filter portions 121 and the light shielding unit 122 may be located on the same plane. That is, the first and second filter portions 121 and the light shielding unit 122 may be located on the light source unit 110. In this case, the filter unit and the light shielding unit form a single sheet. The light shielding unit is located between the first and second filter portions to prevent a light leakage occurring at a boundary surface between the first and second filter portions.

Hereinafter, various modified embodiments of the lamp according to the present invention will be described.

Figure 6:
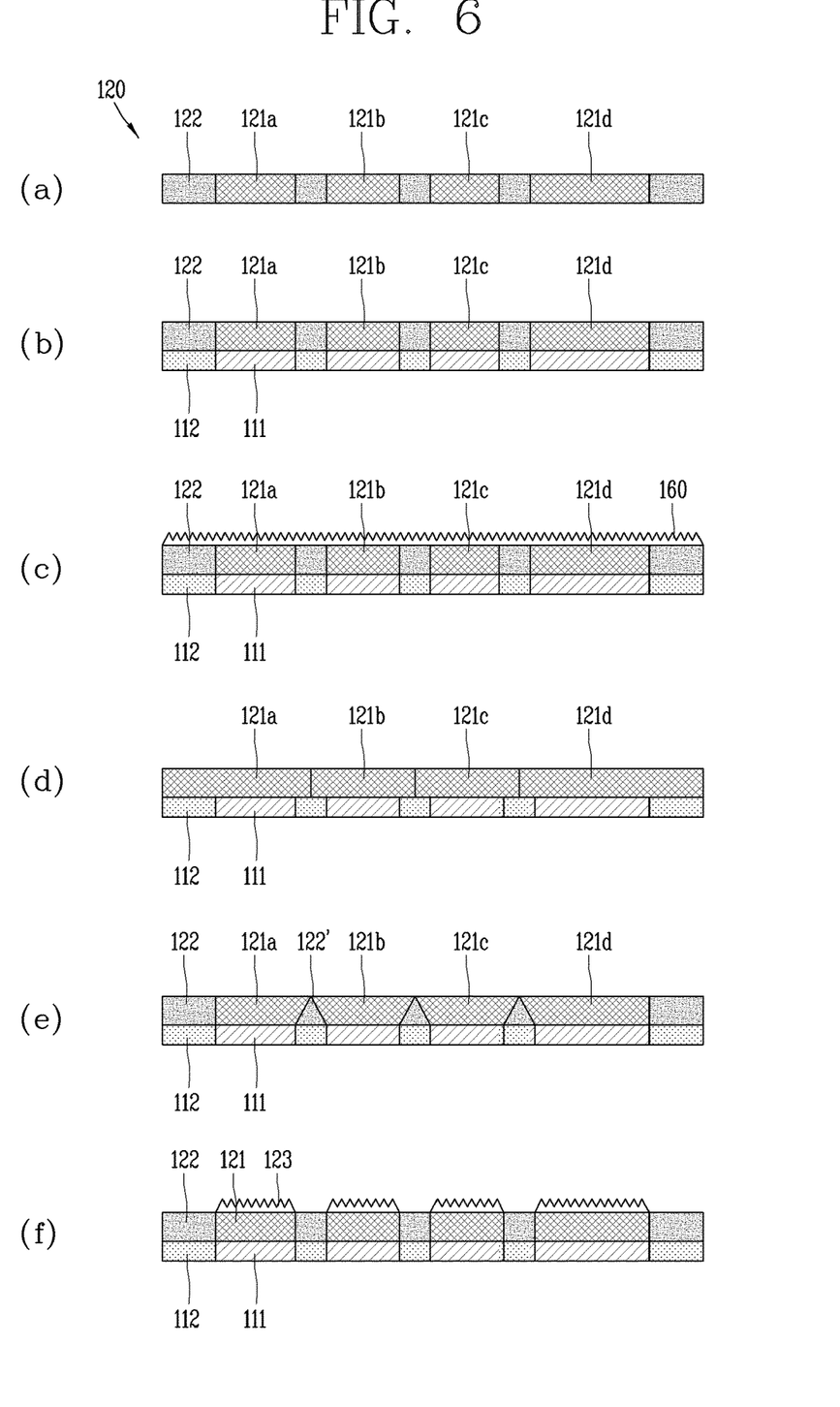
FIG. 6 is a conceptual view illustrating various modified embodiments of a car lamp according to the present invention.

FIG. 6 is a conceptual view illustrating various modified embodiments of a car lamp according to the present invention.

In FIG. 6, the bracket 130, the housing 150, and the lens 140 are omitted for the sake of explanation, but the lamp illustrated in FIG. 6 may include at least one of the bracket 130, the housing 150, and the lens 140.

Referring to (a) of FIG. 6, the light shielding units 122 may be located between different types of filter portions 121a to 121d. Here, the different types of filter portions 121a to 121d and the light-shielding units 122 may be located on the same plane and form one sheet.

In addition, referring to (b) of FIG. 6, the light shielding unit may be located to overlap the non-light emitting region 112, and located not to overlap the light emitting region 111 to minimize a light loss. The light emitting regions 111 overlap the different types of filter portions 121a to 121d.

Meanwhile, the light source unit 110 may be formed to be bendable. In detail, when organic light emitting devices are located in the light emitting regions of the light source unit 110, the light source unit 110 may be bendable. This allows a free design of the lamp.

When a part of the light source unit 110 is formed in a bent (or curved) shape, as illustrated in (c) and (f) of FIG. 6, the lamp according to the present invention may further include light-transmitting layers 123 and 160 that overlap the light emitting regions and are bendable.

The light-transmitting layers 123 and 160 protect the light source unit 110 and allow light to be uniformly emitted from the light source unit in the bent shape. The light-transmitting layers 123 and 160 may be a separate layer and be located to overlap the light source unit 110.

On the other hand, the light-transmitting layer may alternatively be formed as a partial region of the light shielding unit other than a separate layer. That is, the light-transmitting region included in the light-shielding unit may serve as the light-transmitting layer. In this specification, the light-transmitting layer and the light-transmitting region are described as the same component.

On the other hand, when the light source unit is convexly curved toward the outside, light spreads widely. In this case, the lamp including the light source unit cannot concentrate light on a specific region, thereby failing to provide sufficient visibility to a driver. In order to prevent this, the present invention may further include a concave-convex portion formed on the light-transmitting layer.

Specifically, the light-transmitting layer may be provided with the concave-convex portion for changing a proceeding direction of light. The concave-convex portion serves to concentrate light emitted from the bent light source onto one point. Accordingly, the present invention can concentrate light on a specific region even when the light source unit in the bent or curved shape is used.

On the other hand, referring to (e) of FIG. 6, a width of the light shielding unit becomes wider toward the light source unit, and becomes narrower away from the light source unit. Thus, an area where the light shielding unit obscures the light source unit can be minimized, thereby maximizing a light emission area.

In one embodiment, the light-shielding unit may be made of a material having high reflectance. Specifically, the light shielding unit may be made of a metallic material having high reflectance, or a coating layer having high reflectance may be formed on a surface of the light-shielding unit. In this case, the light-shielding unit reflects light traveling to a side surface the filter unit so that the light is emitted to the outside. Thus, the present invention can increase a quantity of light of the lamp.

Meanwhile, the lens 140 included in the car lamp according to the present invention may be implemented in various forms. Hereinafter, various modified embodiments of the lens provided in the car lamp according to the present invention will be described.

Figure 7:
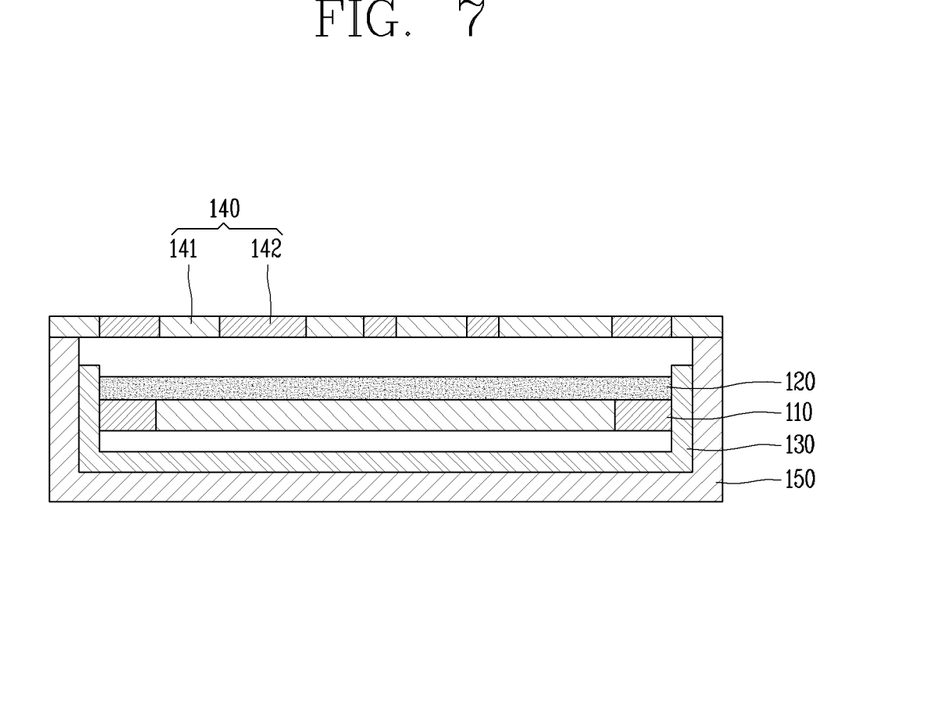
FIG. 7 is a cross-sectional view of a car lamp including a lens having a light shielding region.
Figure 8:
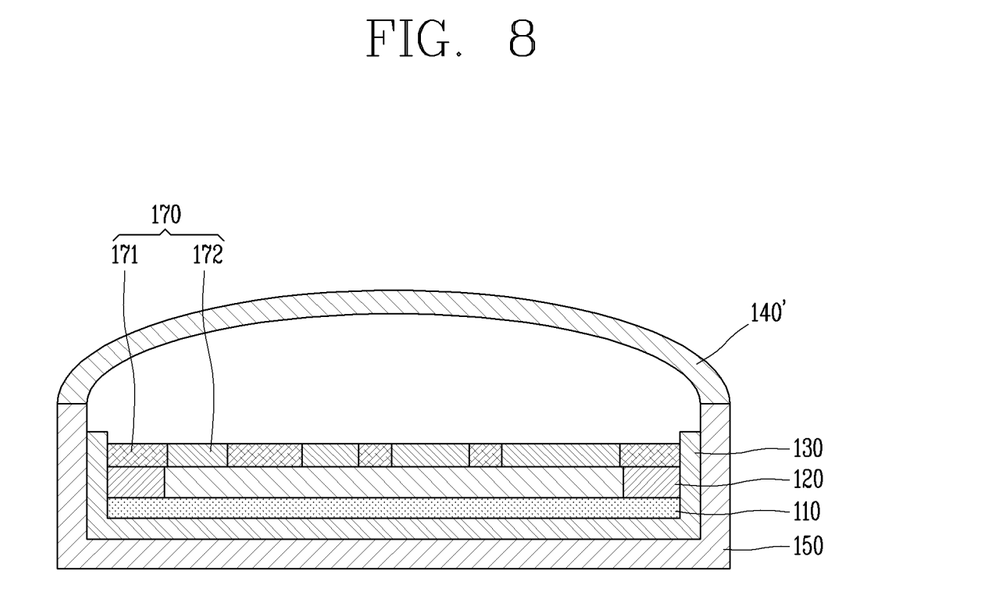
FIG. 8 is a sectional view of a car lamp including a curved lens.
Figure 9:
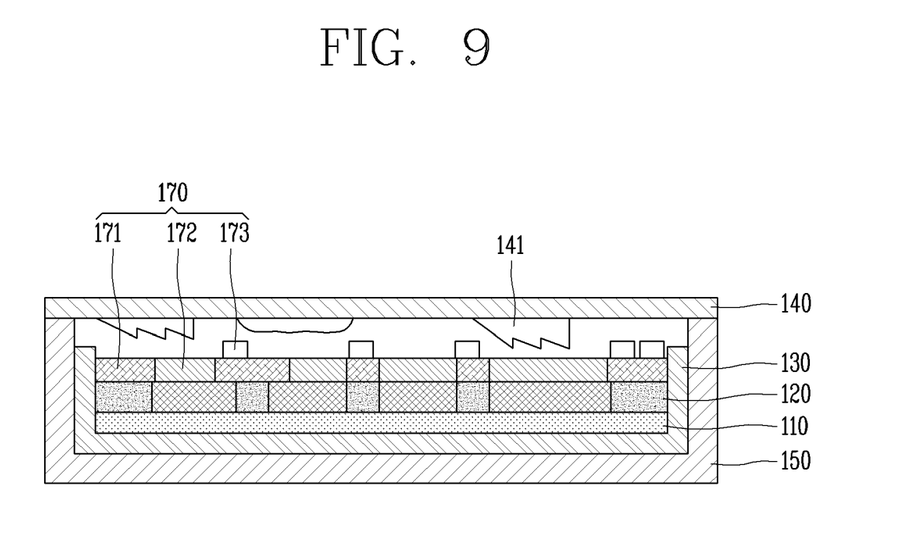
FIG. 9 is a sectional view of a car lamp including a pattern portion.

FIG. 7 is a sectional view of a car lamp including a lens having a light shielding region, FIG. 8 is a sectional view of a car lamp including a curved lens, and FIG. 9 is a sectional view of a car lamp including a pattern portion.

The lens included in the lamp according to the present invention may shield a part of light emitted from the light emitting regions. In detail, referring to FIG. 7, the lens 140 included in the car lamp according to the present invention includes a light-transmitting region 141 and a light shielding region 142. A lighting pattern may differ depending on a pattern of the light shielding region 142 formed in the lens 140. The present invention may increase a degree of design freedom by forming the light shielding region 142 in the lens 140.

Meanwhile, the lens included in the car lamp according to the present invention may include a curved region. Specifically, referring to FIG. 8, a curved region formed on a lens 140' allows a lighting pattern of the lamp to be viewed in a three-dimensional manner. Accordingly, the present invention can realize a three-dimensional lighting effect even if the plurality of light emitting regions is arranged on the same plane.

Referring to FIG. 9, the lens included in the car lamp according to the present invention may include a pattern portion 141. Specifically, the pattern portion 141 included in the lens 140 plays a role similar to the concave-convex portion formed on the light-transmitting layer. The pattern portion 141 serves to concentrate light emitted from the light emitting regions onto a specific direction. In addition, a stereoscopic lighting effect can be realized according to a shape of the pattern portion 141.

On the other hand, an auxiliary light source 173 may be located on the light shielding region 171 of the light shielding unit 170. The auxiliary light source 173 may increase a quantity of light directed toward a specific direction so that the lamp can satisfy a light distribution rule.

Meanwhile, the light source unit included in the car lamp according to the present invention may be directly coupled to the housing without a bracket.

Figure 10:
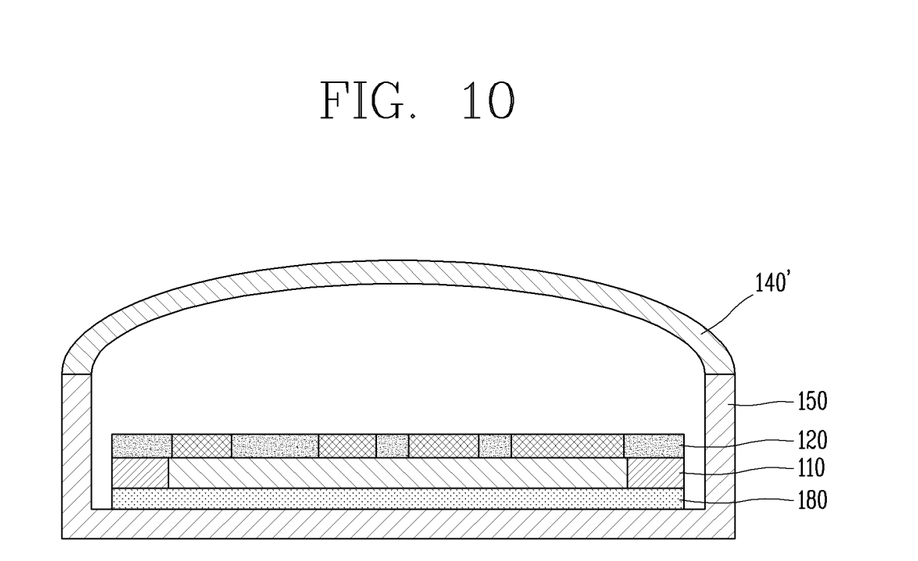
FIG. 10 is a sectional view of a car lamp having an adhesive layer.

FIG. 10 is a sectional view of a car lamp having an adhesive layer.

As illustrated in FIG. 10, the light source unit 110 may be coupled to the housing 150 through an adhesive. In this case, an adhesive layer 180 is provided between the light source unit 110 and the housing 150. Since the structure of FIG. 10 does not use a bracket, the lamp can be made thinner in thickness.

Meanwhile, the lamp according to the present invention provides a structure for increasing a quantity of light of the lamp. Specifically, an organic light emitting device used in the lamp according to the present invention has a structure in which a hole injection layer, a hole transporting layer, a light emitting layer, an electron transporting layer, and an electron injection layer are stacked in a sequential manner.

However, since a light emitting device including a hole injection layer, a hole transporting layer, a light emitting layer, an electron transporting layer, and an electron injection layer one by one does not emit a great quantity of light, a lamp using such light emitting device is difficult to satisfy the light distribution rule.

The present invention uses a device formed by stacking a plurality of unit devices in each of which a hole injection layer, a hole transporting layer, a light emitting layer, an electron transporting layer, and an electron injection layer are stacked in a sequential manner. In detail, an organic light emitting device according to the present invention uses a light emitting device in which two or three unit devices are stacked.

On the other hand, in order to maximize lighting efficiency of each of the unit devices, a charge generating layer may be located between the unit devices. The charge generating layer is in contact with the hole injection layer of the unit device which is arranged on an upper side and an electron injection layer of the unit device which is arranged on a lower side. That is, an upper surface of the charge generating layer is in contact with the hole injection layer, and a lower surface thereof is in contact with the electron injection layer.

When the unit devices are stacked with the structure, light extraction efficiency of the unit device arranged on a relatively lower side is inevitably lower than light extraction efficiency of the unit device arranged on a relatively upper side.

In order to increase the light extraction efficiency of the unit device located on the lower side, the present invention can allow the charge generating layer to have a refractive index between a refractive index of the hole injection layer in contact with the upper surface of the charge generating layer and a refractive index of the electron injection layer in contact with the lower surface of the charge generating layer. Accordingly, the present invention prevents light emitted from the unit device arranged on the relatively lower side from being totally reflected by the charge generating layer.

It will be apparent to those skilled in the art that the present invention may be embodied in other specific forms without departing from the spirit or essential characteristics thereof.

Therefore, it should also be understood that the above-described embodiments are not limited by any of the details of the foregoing description, unless otherwise specified, but rather should be construed broadly within its scope as defined in the appended claims, Therefore, all changes and modifications that fall within the metes and bounds of the claims, or equivalents of such metes and bounds are therefore intended to be embraced by the appended claims.

What is claimed is:

1. A car lamp, comprising:
a light source unit provided with a plurality of semiconductor light emitting devices, and having a planar shape, including a light emitting region emitting light and a non-light emitting region formed along an edge of the light emitting region; and
a filter unit located to overlap the light emitting region so as to transmit only light of a predetermined wavelength band therethrough,
wherein the light emitting region of the light source unit is provided with a plurality of regions, and is configured such that at least one of the plurality of regions selectively emits light,
wherein the non-light emitting region which does not emit light is formed along an edge of each of the plurality of regions,
wherein each of the regions is provided with a light shielding unit located at the edge thereof,
wherein the filter unit comprises:
a first filter portion overlapping one of the plurality of regions to transmit only light of a predetermined wavelength band therethrough, and
a second filter portion overlapping another region different from the one region to transmit only light of a wavelength band different from the light of the predetermined wavelength band,
wherein the first and second filter portions and the light shielding unit are located on the same plane, and
wherein a width of the light shielding unit becomes wider toward the light source unit.

2. The lamp of claim 1, wherein the light source unit is bendable.

3. The lamp of claim 2, further comprising a light-transmitting layer overlapping the plurality of light emitting regions and formed to be bendable.

4. The lamp of claim 3, wherein the light-transmitting layer includes a concave-convex portion to change a proceeding direction of light.

5. The lamp of claim 1, wherein each of the plurality of light emitting regions emits white light,
wherein the first filter portion transmits red light therethrough, and
wherein the second filter portion transmits yellow light therethrough.

6. The lamp of claim 5, wherein at least one of the plurality of light emitting regions does not overlap the filter unit so that white light is emitted to outside.

7. The lamp of claim 1, further comprising a heat dissipation layer located below the light source unit.

8. The lamp of claim 1, further comprising a lens unit located above the light source unit,
wherein the lens unit is provided with a light shielding region located on a partial region thereof to absorb light.

* * * * *